United States Patent
Liu

(10) Patent No.: US 9,660,579 B2
(45) Date of Patent: *May 23, 2017

(54) VOLTAGE CONTROLLED OSCILLATOR WITH A LARGE FREQUENCY RANGE AND A LOW GAIN

(71) Applicant: TAIWAN SEMICONDUCTOR MANUFACTURING CO., LTD., Hsin-Chu (TW)

(72) Inventor: Chih-Min Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 54 days.

This patent is subject to a terminal disclaimer.

(21) Appl. No.: 14/679,057

(22) Filed: Apr. 6, 2015

(65) Prior Publication Data

US 2015/0214893 A1 Jul. 30, 2015

Related U.S. Application Data

(63) Continuation of application No. 13/760,105, filed on Feb. 6, 2013, now Pat. No. 9,024,694.

(51) Int. Cl.

| | |
|---|---|
| *H03K 3/03* | (2006.01) |
| *H03B 5/24* | (2006.01) |
| *H03L 5/00* | (2006.01) |
| *H03L 7/08* | (2006.01) |
| *H03L 7/06* | (2006.01) |
| *H03L 7/099* | (2006.01) |

(52) U.S. Cl.
CPC .................. *H03B 5/24* (2013.01); *H03L 5/00* (2013.01); *H03L 7/06* (2013.01); *H03L 7/08* (2013.01); *H03L 7/099* (2013.01); *H03L 7/0995* (2013.01); *H03L 7/0997* (2013.01)

(58) Field of Classification Search
CPC ... H03L 7/18; H03L 7/08; H03L 7/099; H03L 7/06; H03L 5/00
USPC ............... 331/16, 34, 57, 167, 177 V, 117 R, 331/117 FE; 327/270, 269
See application file for complete search history.

(56) References Cited

U.S. PATENT DOCUMENTS 7,573,339 B2 8/2009 Cong
7,786,771 B2 8/2010 Tsai et al.
(Continued)

OTHER PUBLICATIONS

Williams, S., et al, "An Improved CMOS Ring Oscillator PLL with Less Than 4ps FMS Accumulated Jitter", Custom Integrated Circuits Conference, IEEE, 2004, pp. 151-154.

*Primary Examiner* — Arnold Kinkead
(74) *Attorney, Agent, or Firm* — Duane Morris LLP

(57) ABSTRACT

A circuit includes a voltage controlled oscillator ("VCO") having a VCO cell. The VCO cell includes a first transistor and a second transistor. The first transistor has a gate terminal coupled to a first node that also is coupled to a low-pass filter from which the gate terminal receives a first control voltage signal. A second terminal of the first transistor is connected to a first voltage source. The second transistor has a gate terminal coupled to a second node that is disposed between a capacitor and a resistor of the low pass filter. The second transistor has a second terminal connected to the first voltage source. The second transistor is larger than the first transistor, and the VCO has an output terminal for providing an output frequency signal.

20 Claims, 5 Drawing Sheets

(56) References Cited

U.S. PATENT DOCUMENTS

| | | | |
|---|---|---|---|
| 9,024,694 B2* | 5/2015 | Liu | H03L 5/00 |
| | | | 327/156 |
| 2006/0145773 A1 | 7/2006 | Lin | |
| 2008/0252387 A1 | 10/2008 | Higashi | |
| 2008/0284529 A1 | 11/2008 | Refeld et al. | |
| 2009/0146752 A1* | 6/2009 | O'Day | H03L 1/02 |
| | | | 331/176 |
| 2010/0026397 A1* | 2/2010 | Matsudera | H03L 7/0893 |
| | | | 331/34 |

* cited by examiner

VOLTAGE CONTROLLED OSCILLATOR WITH A LARGE FREQUENCY RANGE AND A LOW GAIN

CROSS-REFERENCE TO RELATED APPLICATIONS

This application is a continuation of U.S. patent application Ser. No. 13/760,105, filed Feb. 6, 2013, the entirety of which is incorporated by reference herein.

BACKGROUND

The Voltage controlled oscillator ("VCO") plays an important role in the operation of a Phase Lock Loop ("PLL"). A typical PLL generates an output signal the phase of which is related to the phase of a reference signal (the input signal).

As is known in the art, the gain of a VCO ($K_{VCO}$) is defined as the operational frequency range divided by the control voltage range, typically in the units of MHz/V. While having a large $K_{VCO}$, is generally desirable (for example, a large $K_{VCO}$, may allow the VCO to be used in a diverse variety of applications), if $K_{VCO}$ becomes too large then stability and/or noise performance of the VCO will degrade which reduces the effectiveness of the VCO. With modern VCO applications, the value of voltage source $V_{DD}$ is reduced which consequently reduces the operating range of the control voltage signal $V_C$ and therefore increases $K_{VCO}$. Additionally, modern VCO applications require higher operational speed and data rate thereby increasing the operational frequency range of the VCO which, consequently, increases $K_{VCO}$ even further. The result is that $K_{VCO}$ becomes too large to maintain the necessary stability and/or noise performance requirements.

Therefore, there is a need to have a VCO with a larger operational frequency range will maintaining a low $K_{VCO}$ to maintain stability and/or noise performance of the VCO.

DETAILED DESCRIPTION

With reference to the figures where like elements have been given like numerical designations to facilitate an understanding of the present subject matter, various embodiments of a system and method for compensating for timing misalignments are described. In order to more fully understand the present subject matter, a brief description of applicable circuitry will be helpful.

Figure 1:
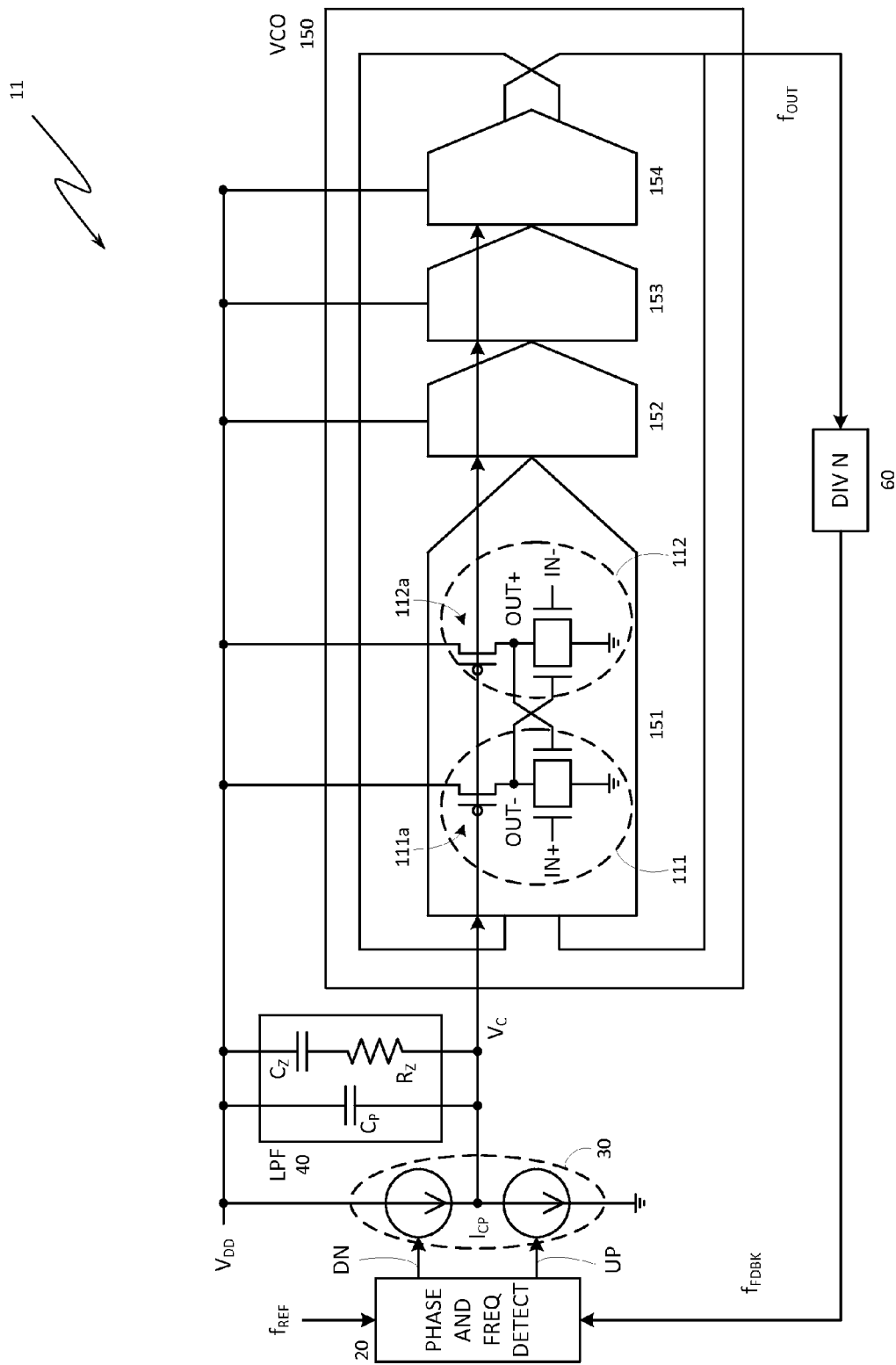
FIG. 1 is a simplified schematic drawing of a phase lock loop with a voltage controlled oscillator.

An exemplary PLL 11 is shown in FIG. 1. The PLL 11 includes a phase-frequency detector 20, a charge pump 30, a low pass filter 40, a differential VCO 150, and a divider circuit 60. The low pass filter 40 includes a first capacitor, denoted $C_P$, and a second capacitor, denoted $C_Z$, which is arranged in series with a resistor, denoted $R_Z$. Typically, the capacitance of capacitor $C_Z$ is ten times the capacitance of capacitor $C_P$.

The VCO 150 includes one or more VCO cells; as shown, VCO 150 is a four stage VCO and has four VCO cells numbered 151, 152, 153, and 154. One of skill in the art will readily understand that a typical VCO in a PLL may contain more or fewer than four stages. The VCO cells in VCO 150 are cascaded and looped and each VCO cell provides a time delay $T_d$ which is typically in the picosecond range. The output of differential VCO 150, denoted $f_{OUT}$, can be determined by the equation:

$$f_{OUT} = \frac{1}{2 \times M \times T_d}$$

where M=the number of stages in the VCO

In the PLL 11, the charge pump 30, the low pass filter 40, and the VCO cells 151-154 are each connected to a voltage source denoted $V_{DD}$. Certain details of VCO cell 151 are shown which include a first CMOS (complementary metal oxide semiconductor) 111 which includes a first PMOS (a p-channel MOSFET (metal oxide semiconductor field effect transistor)) 111a, and a second CMOS 112 which includes a second PMOS 112a. CMOS 111 and CMOS 112 are connected between voltage source $V_{DD}$ and ground, as shown.

In operation, phase-frequency detector 20 receives a reference signal, denoted $f_{REF}$, and compares a feedback signal, denoted $f_{FDBK}$, to $f_{REF}$. Alternatively, the frequency control signal may be derived from a comparison of the phase of the reference signal with the phase of the feedback signal. Based on the results of the comparison of $f_{FDBK}$ to $f_{REF}$, the phase-frequency detector 20 provides a frequency control signal to charge pump 30. As is known in the art, if $f_{FDBK}$ is greater than $f_{REF}$, the frequency control signal DN will be supplied to charge pump 30, whereas if $f_{FDBK}$ is less than $f_{REF}$, the frequency control signal UP will be supplied to charge pump 30. The charge pump 30 receives the appropriate frequency control signal and generates therefrom a control current signal, denoted $I_{CP}$, as is known in the art. The control current signal $I_{CP}$ is operated on by low pass filter 40 to thereby generate a control voltage signal, denoted $V_C$.

The control voltage signal $V_C$ is applied to the gate terminal of each of PMOS 111a and PMOS 112a, as is known in the art. PMOS 111a and PMOS 112a are controlled by the control voltage signal $V_C$ such that the current through PMOS 111a and PMOS 112a changes in response thereto. For example, as is known in the art, a higher current through PMOS 111a and PMOS 112a causes the delay value $T_d$ of VCO cell 151 to decrease which causes the output of the VCO 150, $f_{OUT}$, to increase. Likewise, a lower current through PMOS 111a and PMOS 112a causes the delay value $T_d$ of VCO cell 151 to increase which causes the output of the VCO 150, $f_{OUT}$, to decrease. As stated above, VCO 150 provides an output $f_{OUT}$ which is input to divider circuit 60. Divider circuit 60 divides $f_{OUT}$ by a predetermined value N, as is known in the art, to produce feedback signal $f_{FDBK}$.

Figure 2:
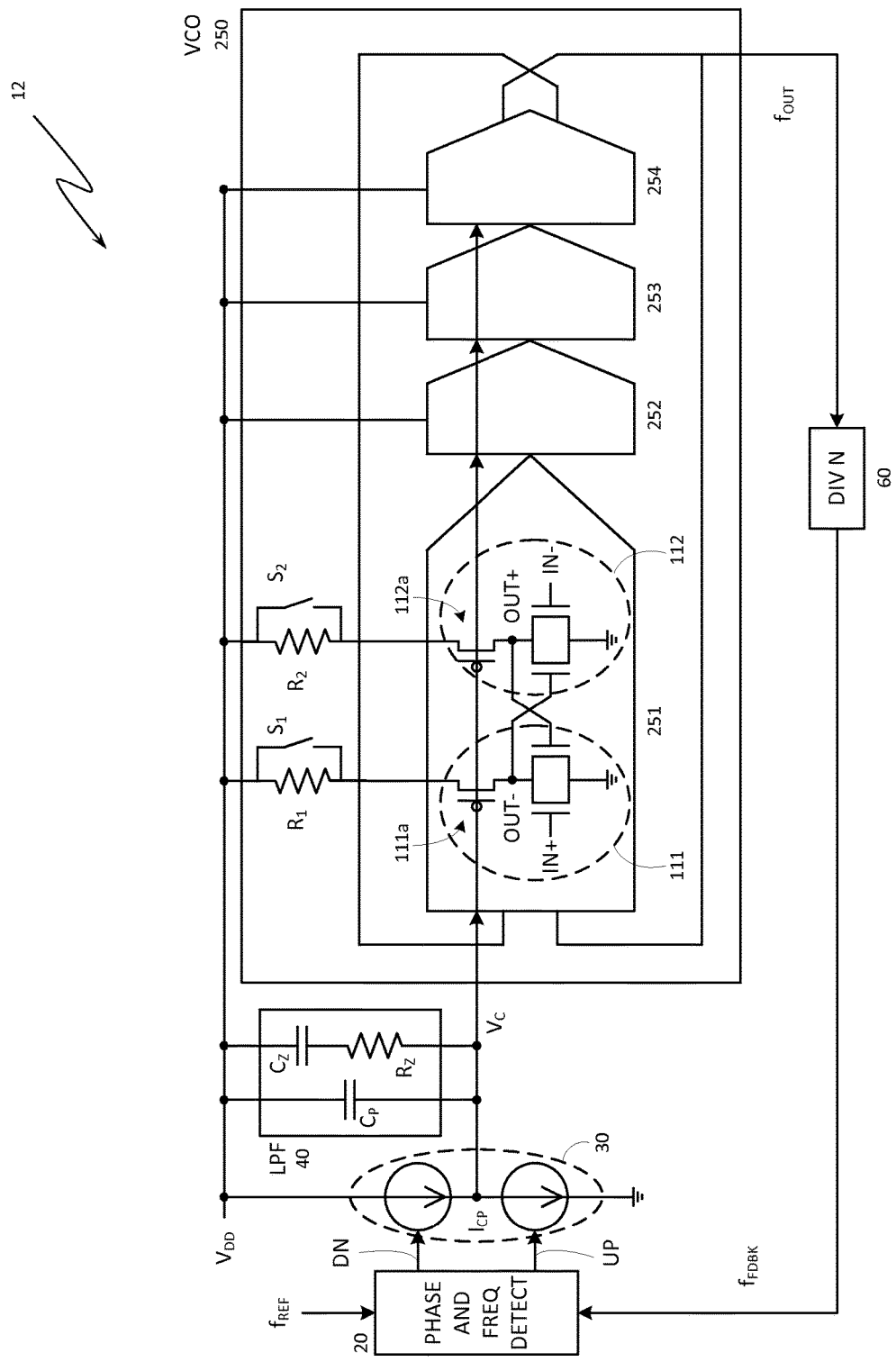
FIG. 2 is a simplified schematic drawing of a phase lock loop with a voltage controlled oscillator according to an embodiment of the present subject matter.

FIG. 2 is a simplified schematic drawing of a phase lock loop 12 with a voltage controlled oscillator 250 according to an embodiment of the present subject matter. Similar to PLL 11 in FIG. 1, PLL 12 also includes a phase-frequency detector 20, a charge pump 30, a low pass filter 40, and a divider circuit 60, each as described above with respect to FIG. 1. The VCO 250 includes a VCO cell 251 which contains PMOS 111a and PMOS 112a where PMOS 111a and 112a are controlled by the control voltage signal $V_C$ applied to the gate terminals thereof such that the current through PMOS 111a and PMOS 112a changes in response thereto. A terminal of PMOS 111a is connected to voltage source $V_{DD}$ through resistor $R_1$ and switch $S_1$ where $R_1$ and $S_1$ are connected in parallel. Likewise, a terminal of PMOS 112a is connected to voltage source $V_{DD}$ through resistor $R_2$ and switch $S_2$ where $R_2$ and $S_2$ are connected in parallel. Switches $S_1$ and $S_2$ may each be operated automatically based on an electrical control signal as is known in the art. In an embodiment, each VCO cell 252-254 of VCO 250 is configured in a similar way to the configuration described above for VCO cell 251.

For high data rate applications where a large operational frequency range of the VCO 250 is desirable, switches $S_1$ and $S_2$ are closed and therefore resistors $R_1$ and $R_2$, respectively, are shorted out. Thus, VCO 250 operates in a similar manner as described above for VCO 150 in FIG. 1. In this configuration, the transconductance of, for example, PMOS 111a in VCO cell 251 is the same as the transconductance of PMOS 111a in VCO cell 151 in FIG. 1, and may be a predetermined value $G_{m1}$. As is known in the art, the transconductance is representative of a current change in a PMOS device due to a change in a voltage of control voltage signal $V_C$ for the PMOS device. Similarly, in this configuration, the transconductance of, for example, PMOS 112a in VCO cell 251 is the same as the transconductance of PMOS 112a in VCO cell 151 in FIG. 1, and may be a predetermined value $G_{m2}$. In an embodiment, $G_{m1}$ and/or $G_{m2}$ may be in the range of milliamps/volt.

For low data rate applications, switches $S_1$ and $S_2$ in FIG. 2 are open thus placing resistors $R_1$ and $R_2$, respectively, in between voltage source $V_{DD}$ and PMOS 111a and PMOS 112a, respectively. One of the effects of this configuration is that the transconductance for PMOS 111a in VCO cell 251 is reduced to $G'_{m1}$ as follows:

$$G'_{m1} = G_{m1}\left(\frac{1}{1+G_{m1}R_1}\right)$$

where $R_1$ is the resistance value for resistor $R_1$ in FIG. 2. Thus, the current change in PMOS 111a is reduced for a given change in control voltage signal $V_C$. Likewise, the transconductance for PMOS 112a in VCO cell 251 is reduced to $G'_{m2}$ as follows:

$$G'_{m2} = G_{m2}\left(\frac{1}{1+G_{m2}R_2}\right)$$

where $R_2$ is the resistance value for resistor $R_2$ in FIG. 2. Thus, the current change in PMOS 112a is reduced for a given change in control voltage signal $V_C$. In an embodiment, $R_1=R_2$ and $G_{m1}=G_{m2}$ so that $G'_{m1}=G'_{m2}$. Due to the insertion of $R_1$ and $R_2$ between $V_{DD}$ and PMOS 111a and 112a, the current into the VCO 250 is reduced thus reducing the operational frequency range of VCO 250 which, consequently, reduces $K_{VCO}$.

Figure 3:
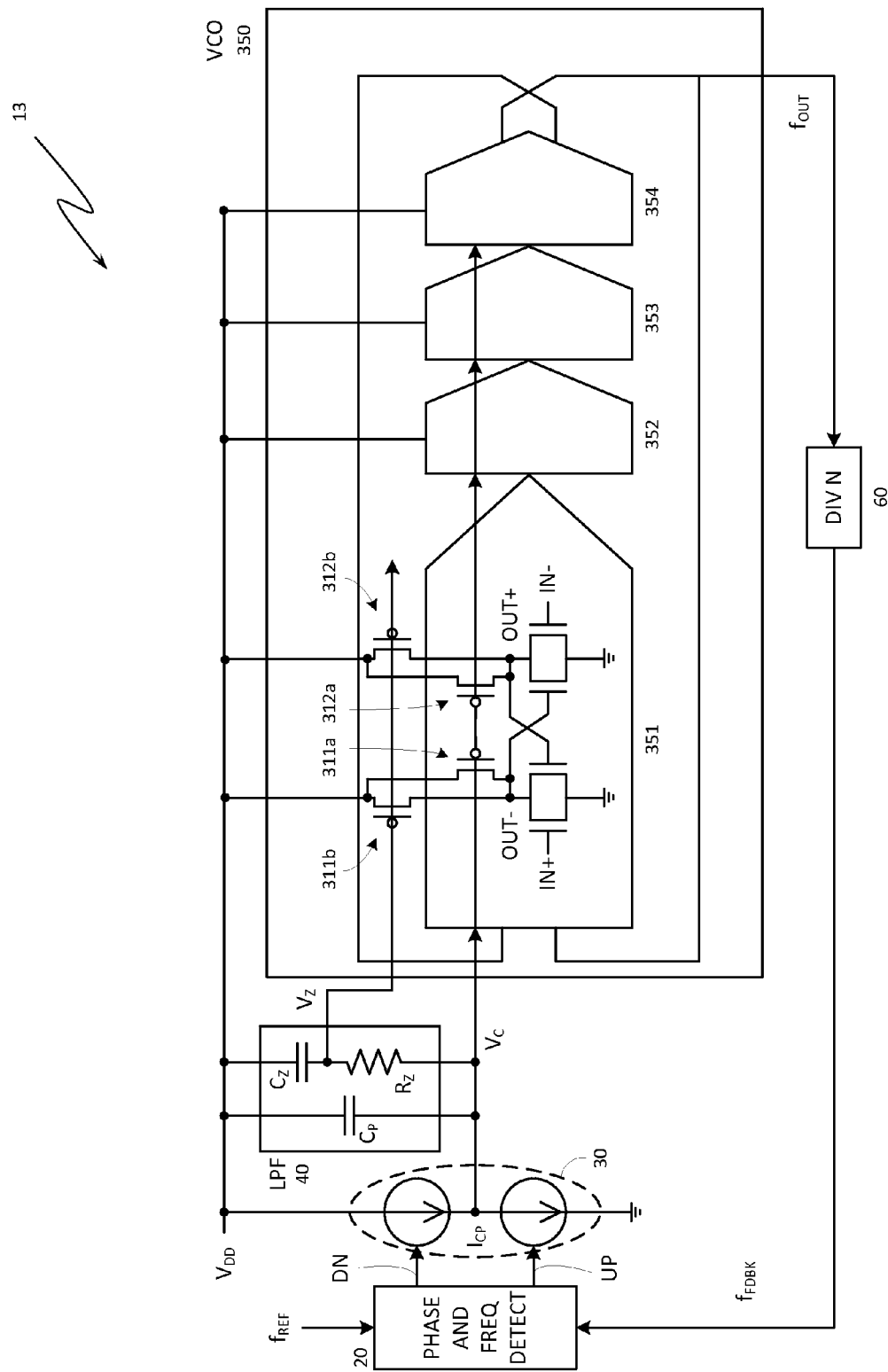
FIG. 3 is a simplified schematic drawing of a phase lock loop with a voltage controlled oscillator according to another embodiment of the present subject matter.

FIG. 3 is a simplified schematic drawing of a phase lock loop 13 with a voltage controlled oscillator 350 according to another embodiment of the present subject matter. Similar to PLL 11 in FIG. 1, PLL 13 also includes a phase-frequency detector 20, a charge pump 30, a low pass filter 40, and a divider circuit 60, each as described above with respect to FIG. 1.

The VCO 350 includes a VCO cell 351 which contains PMOS 311a, PMOS 311b, PMOS 312a, and PMOS 312b. PMOS 311a and 311b are connected in parallel to voltage source $V_{DD}$. Likewise, PMOS 312a and 312b are connected in parallel to voltage source $V_{DD}$. PMOS 311a and 312a are controlled by the control voltage signal $V_C$ applied to the gate terminals thereof such that the current through PMOS 311a and PMOS 312a changes in response thereto. PMOS 311b and 312b are controlled by the control voltage signal $V_Z$ applied to the gate terminals thereof such that the current through PMOS 311b and PMOS 312b changes in response thereto. Control voltage signal $V_Z$ is taken from the junction between capacitor $C_Z$ and resistor $R_Z$ in low pass filter 40. In an embodiment, the capacitance of $C_Z$ is approximately ten times the capacitance of $C_P$. Thus, the voltage of the junction between $C_Z$ and $R_Z$, i.e., $V_Z$, is relatively static in comparison to the voltage of $V_C$. In an embodiment, each VCO cell 352-354 of VCO 350 is configured in a similar way to the configuration described above for VCO cell 351.

In an embodiment, a ratio of the physical size (e.g., the physical length or width) of PMOS 311b to PMOS 311a is K:1, where K>1. In a particular embodiment, K=4. Similarly, a ratio of PMOS 312b to PMOS 312a is also K:1. A comparison of VCO cell 251 in FIG. 2 (in the configuration where switches $S_1$ and $S_2$ are shut) with VCO cell 351 in FIG. 3 reveals that replacing PMOS 111a in VCO cell 251 with PMOS 311a and 311b (connected as shown in FIG. 3) and replacing PMOS 112a in VCO cell 251 with PMOS 312a and 312b (connected as shown in FIG. 3) results in VCO cell 351. As discussed above with respect to FIG. 2, the transconductance for PMOS 111a (in the configuration where switches $S_1$ and $S_2$ are shut) is equal to a predetermined value $G_{m1}$, and the transconductance for PMOS 112a (for this configuration) is equal to a predetermined value $G_{m2}$. For PMOS 311a, it can be seen that the transconductance is equal to $$G_{m1}\left(\frac{1}{1+K}\right),$$

which is less than $G_{m1}$ while for PMOS 312a, the transconductance is equal to $$G_{m2}\left(\frac{1}{1+K}\right)$$

which is less than $G_{m2}$. Therefore, the current into the VCO 350 is reduced thus reducing the operational frequency range of VCO 350 which, consequently, reduces $K_{VCO}$ of VCO 350. The reduction in $K_{VCO}$ is by a factor of $$\left(\frac{1}{1+K}\right).$$

However, the operational frequency range of VCO 350 is not reduced since the charge in capacitor $C_Z$ can adjust while PLL 13 is operating in a long-term non-linear mode.

Figure 4:
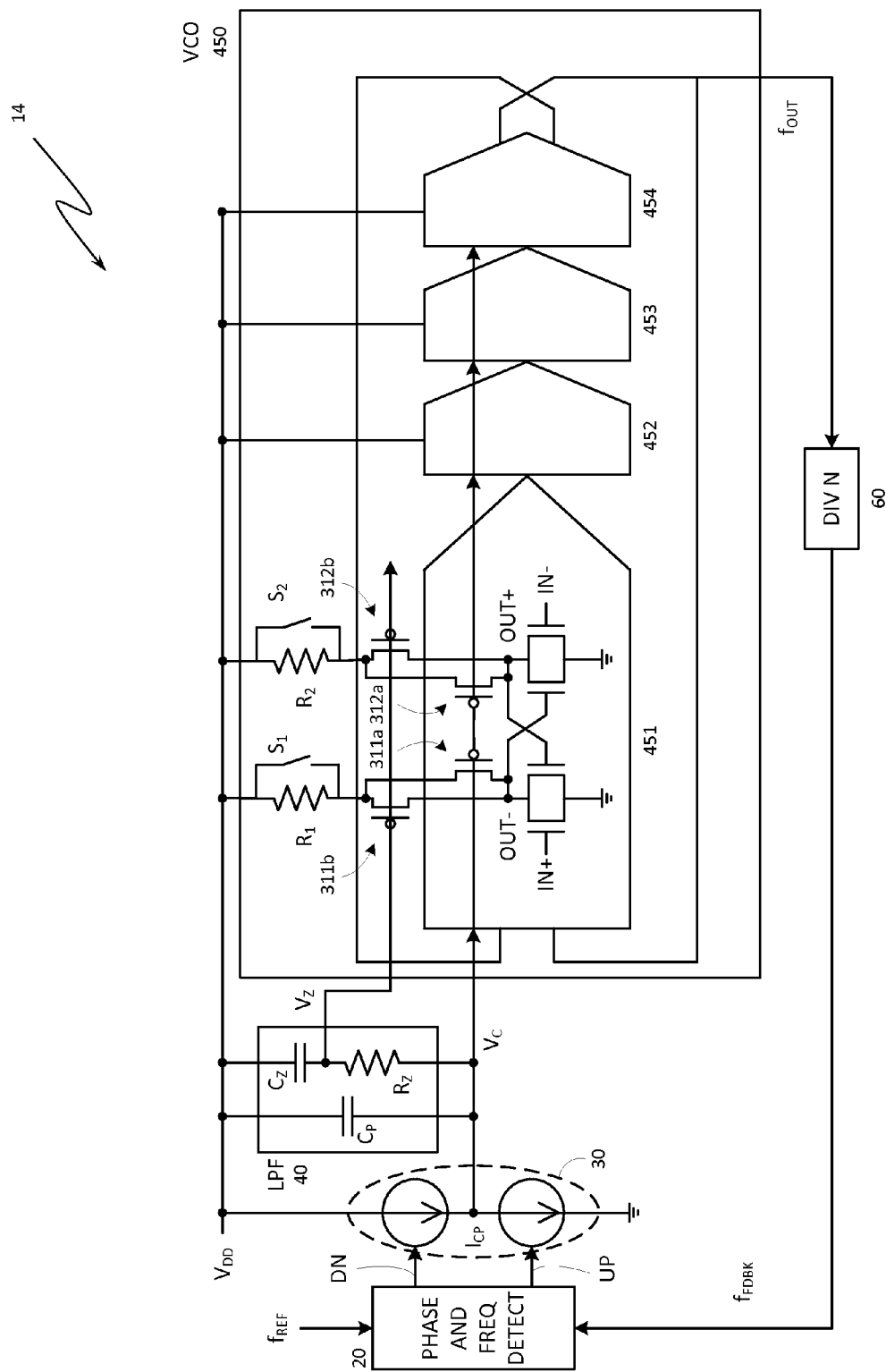
FIG. 4 is a simplified schematic drawing of a phase lock loop with a voltage controlled oscillator according to yet another embodiment of the present subject matter.

FIG. 4 is a simplified schematic drawing of a phase lock loop 14 with a voltage controlled oscillator 450 according to yet another embodiment of the present subject matter. As can be seen from a comparison of FIGS. 2 and 3 with FIG. 4, FIG. 4 is a combination of some components in FIGS. 2 and 3, e.g., VCO 450 includes a VCO cell 451 which contains PMOS 311a, PMOS 311b, PMOS 312a, and PMOS 312b. PMOS 311a and 311b are connected in parallel and are connected to voltage source $V_{DD}$ through resistor $R_1$ and switch $S_1$ where $R_1$ and $S_1$ are connected in parallel. Likewise, PMOS 312a, and PMOS 312b are connected in parallel and are connected to voltage source $V_{DD}$ through resistor $R_2$ and switch $S_2$ where $R_2$ and $S_2$ are connected in parallel. PMOS 311a and 312a are controlled by the control voltage signal $V_C$ applied to the gate terminals thereof such that the current through PMOS 311a and PMOS 312a changes in response thereto. PMOS 311b and 312b are controlled by the control voltage signal $V_Z$ applied to the gate terminals thereof such that the current through PMOS 311b and PMOS 312b changes in response thereto. Control voltage signal $V_Z$ is taken from the junction between capacitor $C_Z$ and resistor $R_Z$ in low pass filter 40.

For low data rate applications, switches $S_1$ and $S_2$ are open thus placing resistors $R_1$ and $R_2$, respectively, in between voltage source $V_{DD}$ and PMOS 311a and 311b and PMOS 312a and 312b, respectively. Therefore, the operation of VCO 450 is a combination of the operating characteristics described above with respect to FIG. 2 (with switches $S_1$ and $S_2$ open) and FIG. 3. The insertion of the resistors $R_1$ and $R_2$ between $V_{DD}$ and PMOS 311a and 311b and PMOS 312a and 312b reduces the current into VCO 450 which reduces the operational frequency range of VCO 450 and, consequently, reduces $K_{VCO}$ of VCO 450. Additionally, the ratio of PMOS 311b to PMOS 311a is K:1, where K>1 and, similarly, a ratio of PMOS 312b to PMOS 312a is also K:1. Consequently, as described above with respect to FIG. 3, this has the effect of reducing the current into VCO 450 which reduces the operational frequency range of VCO 450 and, consequently, reduces $K_{VCO}$ of VCO 450. Thus, $K_{VCO}$ of VCO 450 is lower than $K_{VCO}$ of either VCO 250 in FIG. 2 or VCO 350 in FIG. 3.

While the above embodiments in FIGS. 2 through 4 discuss the use of PMOS, the present inventive subject matter contemplates the use of NMOS as well. FIG. 5A is an exemplary schematic circuit diagram of a portion of a voltage controlled oscillator, such as VCO 350 in FIG. 3, including PMOS 311a and PMOS 311b. As described above, the ratio of PMOS 311b to PMOS 311a is K:1, as shown. Also, PMOS 311a is controlled by control voltage signal $V_C$ while PMOS 311b is controlled by control voltage signal $V_Z$. For the sake of simplicity, PMOS 312a and PMOS 312b, along with other circuit devices, are not shown in FIG. 5A.

Figure 5B:
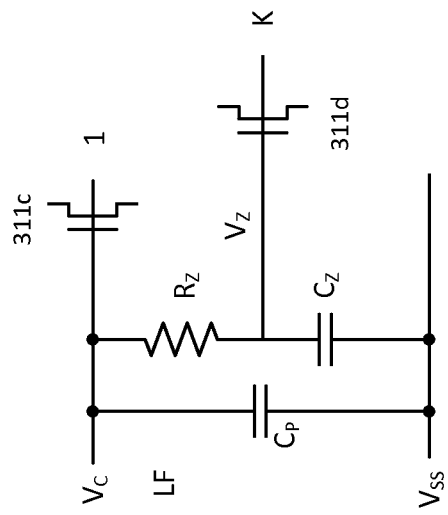
FIG. 5B is an exemplary schematic circuit diagram of a portion of a voltage controlled oscillator according to another embodiment of the present subject matter.
Figure 5A:
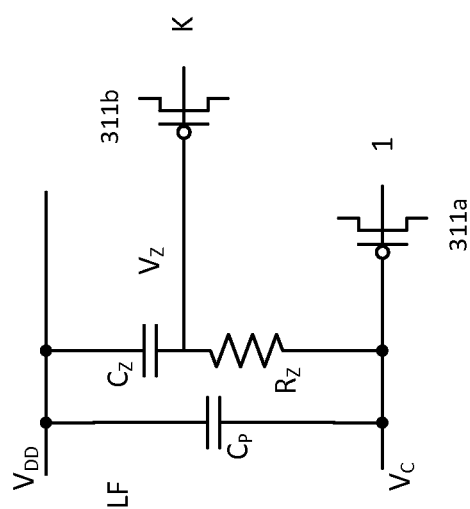
FIG. 5A is an exemplary schematic circuit diagram of a portion of a voltage controlled oscillator according to an embodiment of the present subject matter.

FIG. 5B is an exemplary schematic circuit diagram of a portion of a voltage controlled oscillator, such as VCO 350 in FIG. 3, where NMOS (an n-channel MOSFET) devices are used instead of PMOS devices. NMOS 311c is controlled by control voltage signal $V_C$ while NMOS 311d is controlled by control voltage signal $V_Z$. The ratio of NMOS 311c to NMOS 311d is 1:K. In an embodiment, NMOS devices would also be used to replace PMOS 312a and PMOS 312b in VCO 350 in FIG. 3.

According to embodiments of the present subject matter, a circuit includes a voltage controlled oscillator ("VCO") having a VCO cell which includes a first CMOS circuit including a first PMOS device having a gate terminal which receives a control voltage signal, and having a second terminal operatively connected to a first resistor where the first resistor is operatively connected to a first voltage source, and a second CMOS circuit including a second PMOS device having a gate terminal which receives the control voltage signal, and having a second terminal operatively connected to a second resistor where the second resistor is operatively connected to the first voltage source, and the VCO further having an output terminal and providing an output frequency signal thereon.

In other embodiments of the present subject matter, the circuit above includes a first switch operatively connected in parallel with the first resistor. In yet other embodiments, the circuit further includes a second switch operatively connected in parallel with the second resistor. In still further embodiments, the circuit has an operational parameter D for the first PMOS device which is equal to a predetermined number G when said first switch is closed and the operational parameter D is equal to $$G\left(\frac{1}{1+GR}\right)$$

when the first switch is open, where the operational parameter D is representative of a current change in the first PMOS device due to a change in a voltage of the control voltage signal, and where R is a resistance value for the first resistor.

In still other embodiments, the circuit includes a phase-frequency detector which detects a difference between a reference frequency signal and a feedback frequency signal to thereby produce a frequency control signal, a charge pump which receives the frequency control signal and generates a control current signal therefrom, and a low pass filter operatively connected to the charge pump where the low pass filter integrates the control current signal and generates the control voltage signal therefrom. In yet still other embodiments, this circuit further includes a divider circuit operatively connected to the output terminal of the VCO and to the phase-frequency detector, where the divider circuit reduces a frequency of the output frequency signal to thereby generate the feedback frequency signal. In some embodiments, the phase-frequency detector detects a difference between a phase of a reference signal and a phase of a feedback signal to thereby produce a frequency control signal.

In accordance with additional embodiments of the present subject matter, a circuit includes a phase-frequency detector which detects a difference between a reference frequency signal and a feedback frequency signal to thereby produce a frequency control signal, a charge pump which receives the frequency control signal and generates a control current signal therefrom, a low pass filter operatively connected to the charge pump where the low pass filter integrates the control current signal and generates a first control voltage signal therefrom, and where the low pass filter includes a first capacitor operatively connected to a first resistor, and an output terminal operatively connected to a junction between the first capacitor and the first resistor, where a second control voltage signal is applied to the output terminal. Additionally, the VCO includes a first PMOS device having a gate terminal which receives the first control voltage signal, a second PMOS device having a gate terminal which receives the first control voltage signal, a third PMOS device having a gate terminal which receives the second control voltage signal, and a fourth PMOS device having a gate terminal which receives the second control voltage signal. Also, the VCO further includes an output terminal on which an output frequency signal is placed. Furthermore, the VCO includes a divider circuit operatively connected to the output terminal of the VCO and to the phase-frequency detector, where the divider circuit reduces a frequency of the output frequency signal to thereby generate the feedback frequency signal.

In further embodiments of the above circuit, a first ratio of the third PMOS device to the first PMOS device is K:1, wherein K is a predetermined value and wherein K>1. In still further embodiments, a second ratio of the fourth PMOS device to the second PMOS device is K:1. In yet further embodiments, a second terminal of the first PMOS device is operatively connected to a second terminal of the third PMOS device. In some embodiments, the said phase-frequency detector detects a difference between a phase of a reference signal and a phase of a feedback signal to thereby produce the frequency control signal.

In other embodiments, the second terminal of the first PMOS device is operatively connected to a second resistor where the second resistor is operatively connected to a first voltage source. Yet other embodiments include a first switch operatively connected in parallel with the second resistor. In still other embodiments, a second terminal of the second PMOS device is operatively connected to a second terminal of the fourth PMOS device. In still other embodiments, the second terminal of the second PMOS device is operatively connected to a third resistor where the third resistor is operatively connected to the first voltage source. In yet still other embodiments, a second switch is operatively connected in parallel with the third resistor.

According to yet another embodiment of the present subject matter, a VCO circuit includes a phase-frequency detector which detects a difference between a reference frequency signal and a feedback frequency signal to thereby produce a frequency control signal, a charge pump which receives the frequency control signal and generates a control current signal therefrom, a low pass filter operatively connected to the charge pump where the low pass filter integrates the control current signal and generates a first control voltage signal therefrom, and where the low pass filter includes a first capacitor operatively connected to a first resistor, and an output terminal operatively connected to a junction between the first capacitor and the first resistor, where a second control voltage signal is applied to the output terminal. Additionally, the VCO includes a first NMOS device having a gate terminal which receives the first control voltage signal, a second NMOS device having a gate terminal which receives the first control voltage signal, a third NMOS device having a gate terminal which receives the second control voltage signal, a fourth NMOS device having a gate terminal which receives the second control voltage signal. Also, the VCO further includes an output terminal on which an output frequency signal is placed. Furthermore, the VCO includes a divider circuit operatively connected to the output terminal of the VCO and to the phase-frequency detector, where the divider circuit reduces a frequency of the output frequency signal to thereby generate the feedback frequency signal.

In certain further embodiments of the above circuit, a first ratio of the first NMOS device to the third NMOS device is K:1, where K is a predetermined value and where K>1. In still further embodiments, a second ratio of the second NMOS device to the fourth NMOS device is K:1.

While some embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A circuit, comprising:
   a voltage controlled oscillator ("VCO") having one or more VCO cells, each VCO cell comprising:
      a first transistor having a gate terminal coupled to a low-pass filter from which the gate terminal of the first transistor receives a first control voltage signal, a second terminal of the first transistor coupled to a first voltage source; and
      a second transistor having a gate terminal coupled to a first node of the low pass filter between a first capacitor and a resistor from which the gate terminal of the second transistor receives a second control voltage signal, the second transistor having a second terminal coupled to the first voltage source;
   wherein a ratio of transconductances of the second transistor to the first transistor is K:1, wherein K is a predetermined value and K>1, and
   wherein said VCO has an output terminal for providing an output frequency signal based on the first and the second control voltage signals.

2. The circuit of claim 1, wherein the resistor of the low pass filter is coupled between the first node of the low pass filter and a second node of the low pass filter that is coupled to the gate terminal of the first transistor.

3. The circuit of claim 1, wherein the low pass filter includes a second capacitor that is disposed in parallel with the first capacitor and the resistor of the low pass filter.

4. The circuit of claim 3, wherein the second capacitor of the low pass filter has a smaller capacitor than the first capacitor of the low pass filter.

5. The circuit of claim 1, wherein the gate terminal of the first transistor is coupled to a charge pump.

6. The circuit of claim 1, wherein the VCO cell includes
   a third transistor having a gate terminal coupled to the gate terminal of the first transistor for receiving the first control voltage signal and a second terminal coupled to the first voltage source; and
   a fourth transistor having a gate terminal coupled to the gate terminal of the second transistor for receiving the second control voltage signal and a second terminal coupled to the first voltage source.

7. The circuit of claim 6, wherein the fourth transistor is larger than the third transistor.

8. The circuit of claim 7, wherein the resistor of the low pass filter is coupled between the respective gate terminals of the first and the second transistors.

9. The circuit of claim 8, wherein the low pass filter includes a second capacitor that is disposed in parallel with the first capacitor and the resistor of the low pass filter.

10. The circuit of claim 9, wherein the second capacitor of the low pass filter is smaller than the first capacitor of the low pass filter.

11. A circuit, comprising:
   a low pass filter coupled to a first voltage source and including a first capacitor coupled to a resistor; and
   a voltage controlled oscillator ("VCO") coupled to the low pass filter and including at least one VCO cell, the VCO cell comprising:

a first transistor having a gate terminal and a second terminal, the gate terminal of the first transistor configured to receive a first control voltage signal from the low pass filter, and the second terminal of the first transistor coupled to the first voltage source; and a second transistor having a gate terminal and a second terminal, the gate terminal of the second transistor coupled to a first node of the low pass filter between the first capacitor and the resistor from which the gate terminal of the second transistor receives a second control voltage signal, and the second terminal of the second transistor coupled to the first voltage source;

wherein the second transistor has a larger transconductance than the first transistor, and wherein said VCO has an output terminal for providing an output frequency signal based on the first and the second control voltage signals.

12. The circuit of claim 11, wherein the first capacitor of the low pass filter is coupled between the first voltage source and a second node that is coupled to the gate terminals of the first and the second transistors, and the resistor is coupled between the first node and the second node.

13. The circuit of claim 12, wherein the low pass filter includes a second capacitor that is disposed in parallel with the first capacitor and the resistor.

14. The circuit of claim 13, wherein the first capacitor has a larger capacitance than the second capacitor.

15. The circuit of claim 11, wherein the gate terminal of the first transistor is coupled to a charge pump.

16. The circuit of claim 11, wherein the VCO cell includes
a third transistor having a gate terminal coupled to the gate terminal of the first transistor for receiving the first control voltage signal and a second terminal coupled to the first voltage source; and a fourth transistor having a gate terminal coupled to the gate terminal of the second transistor and a second terminal coupled to the first voltage source.

17. A circuit, comprising:
a voltage controlled oscillator ("VCO") cell comprising:
first and second transistors each having a gate terminal and a second terminal, the gate terminals of the first and second transistors coupled to a low-pass filter which the gate terminals of the first and second transistors are configured to receive a first control voltage signal from a first node of the low-pass filter, and the second terminals of the first and second transistors coupled to a first voltage source; and third and fourth transistors each having a gate terminal and a second terminal, the gate terminals of the third and fourth transistors coupled to a second node of the low-pass filter between a capacitor of the low-pass filter and a resistor of the low-pass filter from which the gate terminals of the third and fourth transistors are configured to receive a second control voltage signal, and the second terminals of the third and the fourth transistors coupled to the first voltage source;

wherein the third and fourth transistors have larger transconductances than the first and second transistors, and wherein said VCO has an output terminal for providing an output frequency signal based on the first and the second control voltage signals.

18. The circuit of claim 17, wherein the capacitor of the low pass filter is a first capacitor, and wherein the low-pass filter includes a second capacitor that is disposed in parallel with the first capacitor and the resistor.

19. The circuit of claim 18, wherein the first capacitor has a larger capacitance than the second capacitor.

20. The circuit of claim 19, wherein the first voltage source is a high voltage source.

* * * * *